(12) United States Patent
Puri

(10) Patent No.: US 7,914,624 B2
(45) Date of Patent: Mar. 29, 2011

(54) SYSTEMS AND METHODS FOR CHARGING A CLEANING SOLUTION USED FOR CLEANING INTEGRATED CIRCUIT SUBSTRATES

(75) Inventor: Suraj Puri, Los Altos, CA (US)

(73) Assignee: Nano OM, LLC, Los Altos, CA (US)

( * ) Notice: Subject to any disclaimer, the term of this patent is extended or adjusted under 35 U.S.C. 154(b) by 0 days.

(21) Appl. No.: 12/503,262

(22) Filed: Jul. 15, 2009

(65) Prior Publication Data

US 2009/0272401 A1  Nov. 5, 2009

Related U.S. Application Data

(63) Continuation of application No. 10/886,785, filed on Jul. 7, 2004, now Pat. No. 7,655,094.

(51) Int. Cl.
  *B08B 7/00* (2006.01)
(52) U.S. Cl. ............... 134/1.3; 134/36; 510/175
(58) Field of Classification Search ............... None
  See application file for complete search history.

(56) References Cited

U.S. PATENT DOCUMENTS

| | | | |
|---|---|---|---|
| 4,837,007 A | | 6/1989 | Duckworth et al. |
| 5,090,432 A | | 2/1992 | Bran |
| 5,476,384 A | | 12/1995 | Giuliani et al. |
| 5,800,576 A | | 9/1998 | Johnson et al. |
| 5,810,037 A | | 9/1998 | Sasaki et al. |
| 5,919,311 A | | 7/1999 | Shive et al. |
| 5,954,885 A | | 9/1999 | Ohmi |
| 6,158,075 A | * | 12/2000 | Tanaka et al. ............ 15/102 |

(Continued)

FOREIGN PATENT DOCUMENTS

WO  WO 00/24687  5/2000

(Continued)

OTHER PUBLICATIONS

Resnick et al., A Study of Cleaning Performance and Mechanisms in Dilute SC-1 Processing, 1995, Materials Research Society, vol. 386, pp. 21-26.*

(Continued)

*Primary Examiner* — Michael Kornakov
*Assistant Examiner* — Nicole Blan
(74) *Attorney, Agent, or Firm* — Harmohinder S. Bedi; EcoTech Law Group, P.C.

(57) ABSTRACT

Inventive methods, systems and compositions of cleaning integrated circuit ("IC") substrates are described. The cleaning methods of the present invention include: charging a solution, which contains at least a solute selected to promote cleaning of the IC substrate, to produce a charged solution, such that at least a portion of the solute is present as clusters in the charged solution; and conveying the charged solution for cleaning the IC substrate.

The cleaning systems of the present invention include: a charging chamber for holding a solution, which contains at least a solute selected to promote cleaning of the integrated circuit substrate; and a first acoustic energy source capable of vibrating the solution in the charging chamber to produce a charged solution such that at least a portion of the solute is present as clusters in the charged solution.

The cleaning compositions of the present invention include: a solvent; and a solute selected to promote cleaning of the IC substrate, wherein at least a portion of the solute is present in cluster form in the solution and the solute and solvent are present in a volumetric ratio that is between about $3\times10^{-5}:1$ and about $1\times10^{-24}:1$.

19 Claims, 2 Drawing Sheets

U.S. PATENT DOCUMENTS

| | | | |
|---|---|---|---|
| 6,378,534 | B1 | 4/2002 | Olesen et al. |
| 6,450,181 | B1 | 9/2002 | Morita et al. |
| 6,568,408 | B2 | 5/2003 | Martens et al. |
| 6,615,854 | B1 | 9/2003 | Hongo et al. |
| 6,681,781 | B2 | 1/2004 | Puri et al. |
| 6,800,142 | B1 | 10/2004 | Tipton et al. |
| 7,007,333 | B1* | 3/2006 | Mikhaylichenko et al. ...... 15/77 |
| 2002/0011253 | A1* | 1/2002 | Puri et al. ............................ 134/1 |
| 2003/0000548 | A1* | 1/2003 | Tsuga et al. .................... 134/1.3 |
| 2003/0010356 | A1 | 1/2003 | Kuyel |
| 2003/0045098 | A1 | 3/2003 | Verhaverbeke et al. |
| 2003/0205240 | A1 | 11/2003 | Bergman |
| 2004/0012104 | A1* | 1/2004 | Ozawa et al. .............. 261/122.1 |
| 2004/0063074 | A1 | 4/2004 | Fisher |
| 2004/0069330 | A1* | 4/2004 | Rolfson ........................ 134/109 |
| 2004/0130965 | A1 | 7/2004 | Achkire et al. |
| 2004/0151062 | A1* | 8/2004 | Yao et al. ....................... 366/137 |
| 2004/0198190 | A1* | 10/2004 | Basol et al. ..................... 451/41 |

FOREIGN PATENT DOCUMENTS

| | | |
|---|---|---|
| WO | WO/2006/010052 | 1/2006 |

OTHER PUBLICATIONS

Hall et al., Effect of SC-1 Process Parameters on Particle Removal and Surface Metallic Contamination, 1995, Materials Research Society, vol. 386, pp. 127-133.*

Suraj Puri, U.S. Appl. No. 11/944,478, OA mailed Dec. 7, 2009, filed Nov. 23, 2007.

Suraj Puri—U.S. Appl. No. 10/886,785, Notice of Allowance dated Sep. 30, 2009, filed Jul. 7, 2004.

Suraj Puri—U.S. Appl. No. 10/886,785, Allowed claims based on Notice of Allowance dated Sep. 30, 2009, filed Jul. 7, 2004.

Suraj Puri—U.S. Appl. No. 10/886,785, filed, Office Action mailed Jun. 24, 2009, filed Jul. 7, 2004.

Suraj Puri—U.S. Appl. No. 10/886,785, Office Action dated Sep. 25, 2007, filed Jul. 7, 2004.

Suraj Puri—U.S. Appl. No. 10/886,785, Office Action dated Feb. 20, 2009, filed Jul. 7, 2004.

Suraj Puri—U.S. Appl. No. 10/886,785, Office Action dated Nov. 6, 2008, filed Jul. 7, 2004.

Suraj Puri—U.S. Appl. No. 10/886,785, Advisory Office Action dated Sep. 8, 2008, filed Jul. 7, 2004.

Suraj Puri—U.S. Appl. No. 10/886,785, Final Office Action dated Jun. 12, 2008 filed Jul. 7, 2004.

Suraj Puri—U.S. Appl. No. 12/503,302, Office Action mailed Nov. 25, 2009-Jul. 15, 2009.

Suraj Puri—PCT Application No. PCT/US05/36892 Written Opinion, completed Feb. 9, 2007, International filing date Oct. 12, 2005.

Suraj Puri, PCT Application No. PCT/US05/36892 IPER, Apr. 17, 2007, International filing date Oct. 12, 2005.

Suraj Puri—Int'l Search Report and Written Opinion, PCT/US2005/024366, completed Nov. 28, 2005, Int'l filing Jul. 7, 2005.

Suraj Puri—PCT Application No. PCT/US05,024366, IPER Dated Jan. 9, 2007, Int'l filing Jul. 7, 2005.

U.S. Appl. No. 11/093,904, OA Mailing Date: Mar. 4, 2009.

Final Office Action, U.S. Appl. No. 11/093,904, Mailing Date: Nov. 13, 2008.

U.S. Appl. No. 11/944,478, OA mailed Dec. 7, 2009.

Suraj Puri, Final Office Action, U.S. Appl. No. 11/093,904, Mailing Date: Nov. 13, 2008.

Suraj Puri, U.S. Appl. No. 11/944,478, OA mailed Dec. 7, 2009.

Suraj Puri, Office Action, U.S. Appl. No. 11/093,904, OA Mailing Date: Oct. 15, 2008.

Suraj Puri, U.S. Appl. No. 11/093,904, OA Mailing Date: Oct. 7, 2009.

Suraj Puri, U.S. Appl. No. 11/093,904, OA mailed Mar. 11, 2008.

Boericke, William, M.D. Pocket Manual of Homeopathic Materia Medica: The Characteristic and Guiding Symptoms of All Remedies, Jain Publishers, ANAND Offset Press, New Delhi-1 10016, $9^{th}$ Edl., (1975).

Gray, Bill, M.D., "Homeopathy, Science or Myth: Physics of Potentized Water?", North Atlantic Books vol. 21, No. 8, pp. 63 and 67, (2005).

Kern, Handbook of Semiconductor Wafer Cleaning Technology, Noyes Publications, pp. 76-81. (1993).

Perry's Chemical Engineers, Handbook, 1997, $7^{th}$, Edition, pp. 8-74 through 8-78. (1997).

Kern, Werner, Handbook of Semiconductor Wafer Cleaning Technology, Science Technology and Applications; pp. 18-22; 38-40; 126-127 (1993).

* cited by examiner

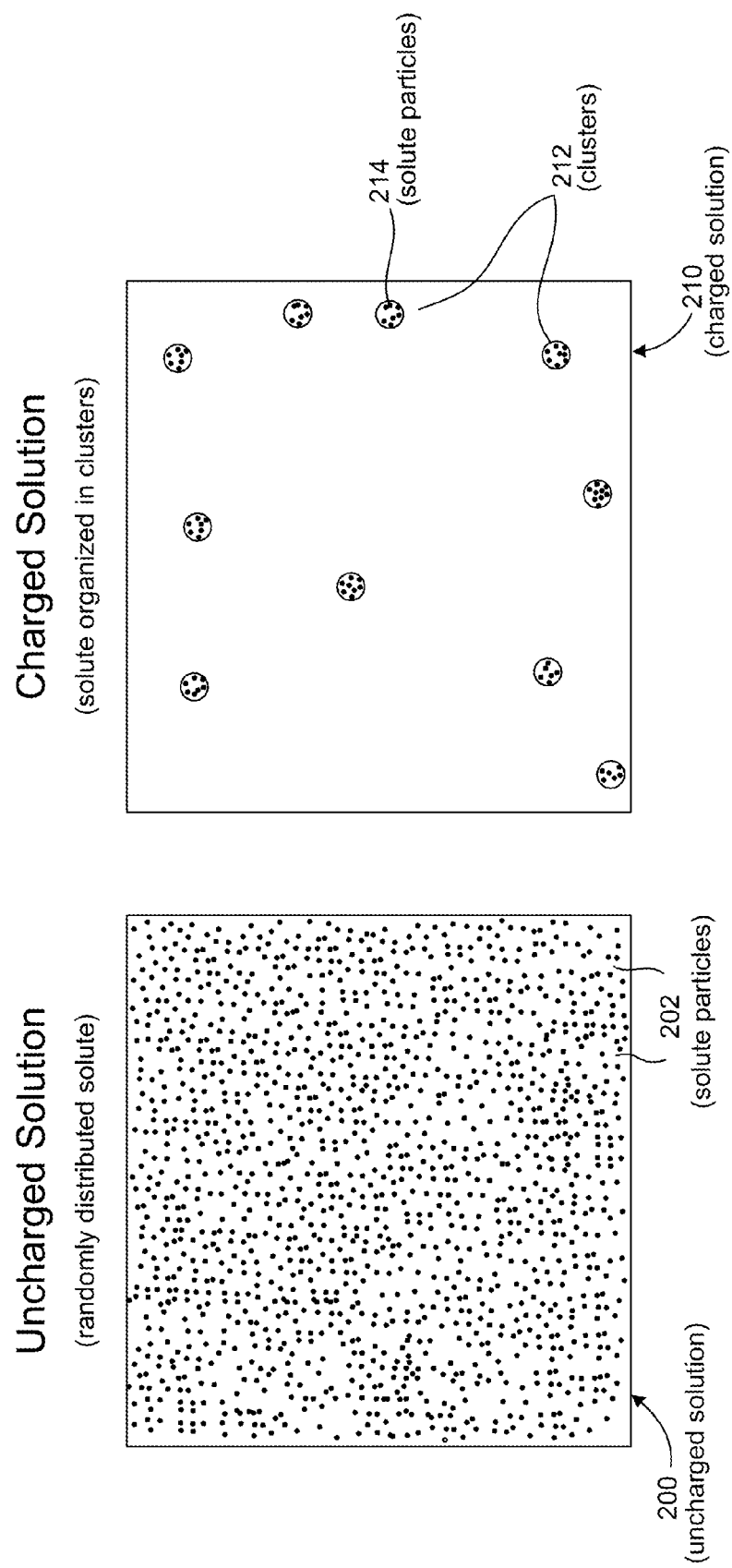

SYSTEMS AND METHODS FOR CHARGING A CLEANING SOLUTION USED FOR CLEANING INTEGRATED CIRCUIT SUBSTRATES

CROSS REFERENCE TO RELATED APPLICATIONS

This application is a continuation of U.S. patent application Ser. No 10/886,785, filed Jul. 7, 2004 now U.S. Pat. No. 7,655,094. This application is incorporated herein by reference in its entirety for all purposes.

FIELD OF THE INVENTION

The present invention relates to systems and methods for effectively cleaning integrated circuit ("IC") substrates. More particularly, the present invention relates to systems and methods for effectively charging a solution before it is used for cleaning IC substrates. In the charged solution, at least a portion of the solute particles are present in cluster form, as solute clusters. The present invention also provides compositions for effective cleaning of IC substrates.

BACKGROUND OF THE INVENTION

During the integrated circuit ("IC") manufacturing process, contaminants, such as particles, photoresist residue and the like, are introduced on the IC substrate surface. It is important to eliminate or reduce the presence of these contaminants as they adversely impact the performance and function of the IC that is ultimately produced. Accordingly, various cleaning methods have been implemented to remove such undesirable contaminants.

A cleaning method commonly used in the semiconductor industry employs a concentrated ammonium hydroxide solution known as the Standard Cleaning Solution 1 (the "SC-1 solution"). In the SC-1 solution, typically heated ammonium hydroxide, hydrogen peroxide and deionized water are present in a volume ratio of approximately 1:1:5. During cleaning, the SC-1 solution contacts the substrate surface in the presence of megasonic energy. It is believed that the SC-1 solution detaches contaminants from the substrate surface through surface etching and that the megasonic energy further removes the detached contaminant from the substrate surface. Although this method has been the cleaning method of choice for most in the semiconductor industry during the last forty years, it suffers from several drawbacks.

Concentrated cleaning solutions run the risk of unduly etching, which appears as surface roughness, and thereby damaging the substrate surface and the devices undergoing cleaning. In a non-patterned semiconductor substrate surface, for example, over etching damages the real estate on the substrate surface, upon which circuitry and transistor devices are subsequently fabricated. For this reason, the resulting semiconductor chip may suffer from poor electrical performance or complete malfunction.

Dispensing highly concentrated cleaning solutions to drain poses environmental concerns. Consequently, the concentrated effluent stream exiting the cleaning system requires appropriate treatment. The cost of an effluent treatment system and labor to implement the cleanup process make the process of cleaning using the SC-1 solution expensive.

Concentrated cleaning solutions also deposit on the substrate surface undesirable metal contaminants which degrade device performance. Moreover, the peroxide composition of the cleaning solution typically contains stabilizers, which is another source of contamination that leads to performance issues. This problem is further exacerbated when relatively high composition of peroxide is used as part of the cleaning solution.

The presence of such contaminant particles even more adversely impact current IC geometries. With the miniaturization of the circuitry on ICs, device sizes are currently approaching progressively smaller scales and such small devices densely populate the IC substrate surface. Contaminant particles of a certain size, which previously did not pose a threat to an IC's performance because the early generation ICs were not as densely populated, now have a significant impact on the electrical performance of current ICs having miniature geometries. In fact, these contaminant particles can render the entire IC useless. As a result, an effective cleaning method for removing such contaminant particles, without damaging the substrate surface, is critical to enhancing the yield of ICs.

In an attempt to circumvent the above-mentioned drawbacks, U.S. Pat. No. 6,681,781 issued to Puri et al. proposes a cleaning solution formed from ultra dilute concentrations of a cleaning enhancement agent (e.g., ammonia gas) in a solvent (e.g., water). In ultra dilute solutions, the solvent and solute are present in volume ratios ranging from 500:1 to 500,000:1. Unfortunately, this process also suffers from drawbacks.

At the high end of ultra dilute ammonium hydroxide concentrations, the reaction of ammonium hydroxide with silicon continues to produce over-etched surfaces in the current IC geometries. To minimize drawbacks of over etching, an ozonating step has been added to the cleaning process. As a protective measure, in this step, the substrate surface undergoes ozonation before it is exposed to the cleaning solution containing a harsh concentration of ammonium hydroxide. Such an additional step, however, lowers the throughput of the cleaning process and the throughput of the overall IC manufacturing process. It also adds to the expense of cleaning the substrate surface.

At the low end of ultra dilute ammonium hydroxide concentrations, the cleaning solutions are simply not effective to detach the contaminant particle from the substrate surface. In other words, cleaning solutions having low concentrations of ammonium hydroxide do not sufficiently react with the substrate surface to detach a desirable amount of contaminant particles from it. Conventional wisdom, as a result, deems cleaning solutions having low concentrations of a cleaning enhancing agent, such as ammonium hydroxide, to be ineffective and undesirable.

What is therefore needed are improved systems and methods of cleaning ICs, which do not suffer the drawbacks of the current IC cleaning processes and effectively clean IC substrate surfaces having the current miniature geometries.

SUMMARY OF THE INVENTION

To achieve the foregoing, the present invention provides systems and methods for effectively charging a solution before using it for cleaning the integrated circuit ("IC") substrate. Charging a solution impacts the distribution of the solute particles throughout the solution. Specifically, in a charged solution, the solute particles are arranged in cluster form and exist as solute clusters. By way of example, each cluster can contain an average of between about 100 and about 200 solute molecules. In sharp contrast, in conventional cleaning solutions, the solute particles are distributed randomly, and not in cluster form.

While wishing not to be bound by theory, the solute clusters in a charged solution of the present invention provide an effective removal mechanism for the detached contaminant particle from the substrate surface. It is believed that the solute clusters trap the contaminant particles, which are initially detached from the substrate surface from the application of acoustic energy. In the absence of such solute clusters, as is the case with conventional cleaning solutions, it is believed that there exists no mechanism to trap such detached particles, which subsequently land on and adhere to the substrate surface.

The present invention recognizes, in accordance with one embodiment, that applying acoustic energy to relatively dilute solutions promotes charging. For example, charging can be accomplished by applying acoustic energy to dilute solutions, where the solute is present in the solvent at a volume ratio that is between about $3 \times 10^{-5}:1$ and about $1 \times 10^{-24}:1$. Such dilute solutions may cover solute concentrations in the ultra dilute regime and at "near zero dilutions." When a solute is present in a solvent at a volumetric ratio that is between about $3 \times 10^{-5}:1$ and $5 \times 10^{-5}:1$, the dilution of the resulting solution is considered to be in the ultra dilute regime. Furthermore, the term "near zero dilution," as used in this specification, refers to dilutions where the solute is present in the solvent at a volumetric ratio that is between about $5 \times 10^{-5}:1$ and $1 \times 10^{-24}:1$.

Regardless of whether the dilution of the solute is in the ultra dilute regime or at near zero dilution, the teachings of the present invention allow for effective cleaning of the substrate, without suffering from the drawbacks encountered when using concentrated or dilute conventional cleaning solutions. In fact, given that relatively dilute solutions are desirable for charging, i.e., forming solute clusters, solutions having "near zero dilutions" are preferred in the present invention. Use of "near zero dilutions" for cleaning substrates goes against conventional wisdom because conventional cleaning techniques require higher concentrations of the solute to facilitate particle removal through a reaction mechanism. As explained above, the particle removal mechanism of the present invention is primarily focused on promoting solute cluster formation, and not focused on promoting the reaction between the solute and the substrate surface.

The present invention provides effective methods for cleaning an IC substrate. Inventive methods include: (i) charging a solution, which contains at least a solute selected to promote cleaning of the integrated circuit substrate, to produce a charged solution, wherein at least a portion of the solute is present as clusters in the charged solution; and (ii) conveying the charged solution for cleaning the integrated circuit substrate.

In accordance with one embodiment of the present invention, charging of the solution is carried out by vibrating the solution, preferably by using megasonic energy. Preferably, the solute is ammonium hydroxide. In accordance with yet another embodiment of the present invention, the charging step includes diluting the solution such that the solute is present in a solvent in a volumetric ratio that is between about $5 \times 10^{-5}:1$ and about $1 \times 10^{-24}:1$, preferably between about $1 \times 10^{-6}:1$ and about $1 \times 10^{-24}:1$, and more preferably between $1 \times 10^{-8}:1$ and about $1 \times 10^{-24}:1$.

In one embodiment, cleaning methods of the present invention further include: (i) diluting the charged solution to produce a cleaning solution; and (ii) using the cleaning solution for cleaning the integrated circuit substrate. According to this embodiment, the charged solution can be further charged to a greater extent by increasing its dilution. In the cleaning solution, the solute may be present in a solvent in a volumetric ratio that is between about $5 \times 10^{-5}:1$ and about $1 \times 10^{-24}:1$, which range ensures that the cleaning solution is effectively charged. Another step of this embodiment includes applying acoustic energy to said cleaning solution, preferably by a megasonic device. Before charging the solution, the present invention also contemplates mixing a solvent and the solute to produce the solution. Preferably, the solvent is deionized water. In certain embodiments, mixing produces the solution having the solute present in the solvent in a volumetric ratio that is between about $3 \times 10^{-5}:1$ and about $1 \times 10^{-24}:1$. Cleaning of the substrate surface can be carried out at about 30° C. or below 30° C.

In another aspect, the present invention provides a system for cleaning integrated circuit substrates. The system includes: (i) a charging chamber for holding a solution, which contains at least a solute selected to promote cleaning of the integrated circuit substrate; and (ii) a first acoustic energy source capable of vibrating the solution in the charging chamber to produce a charged solution, wherein at least a portion of the solute is present as clusters in the charged solution.

The system may further include a processing chamber for cleaning the integrated circuit substrate using the charged solution. In accordance with one embodiment of the present invention, the system includes a second acoustic energy source for vibrating contents of the processing chamber during cleaning the integrated circuit substrate. In preferred embodiments, the present invention further includes a mixing chamber for mixing a solvent and the solute to produce the solution before the charging step commences. A first connection between a solvent reservoir and at a location on the second connection may also be provided for diluting the charged solution before it enters the processing chamber. The second connection defines the connection between the charging chamber and the processing chamber so that the charged solution can be conveyed from the charging chamber to the processing chamber.

In yet another aspect, the present invention provides a composition of a solution used for cleaning integrated circuit substrates. The composition includes a solvent and a solute, which is selected to promote cleaning of the integrated circuit substrate. At least a portion of the solute is present in cluster form in the solution and the solute and solvent are present in a volumetric ratio that is between about $3 \times 10^{-5}:1$ and about $1 \times 10^{-24}:1$. In a preferred embodiment, the solute and solvent are present in a volumetric ratio that is between about $1 \times 10^{-6}:1$ and about $1 \times 10^{-24}:1$.

BRIEF DESCRIPTION OF THE FIGURES

FIG. 2A shows the random distribution of the solute particles in an uncharged solution.

FIG. 2B shows the solute particles arranged in cluster form in a charged solution, according to one embodiment of the present invention.

DETAILED DESCRIPTION OF INVENTION

Figure 1:
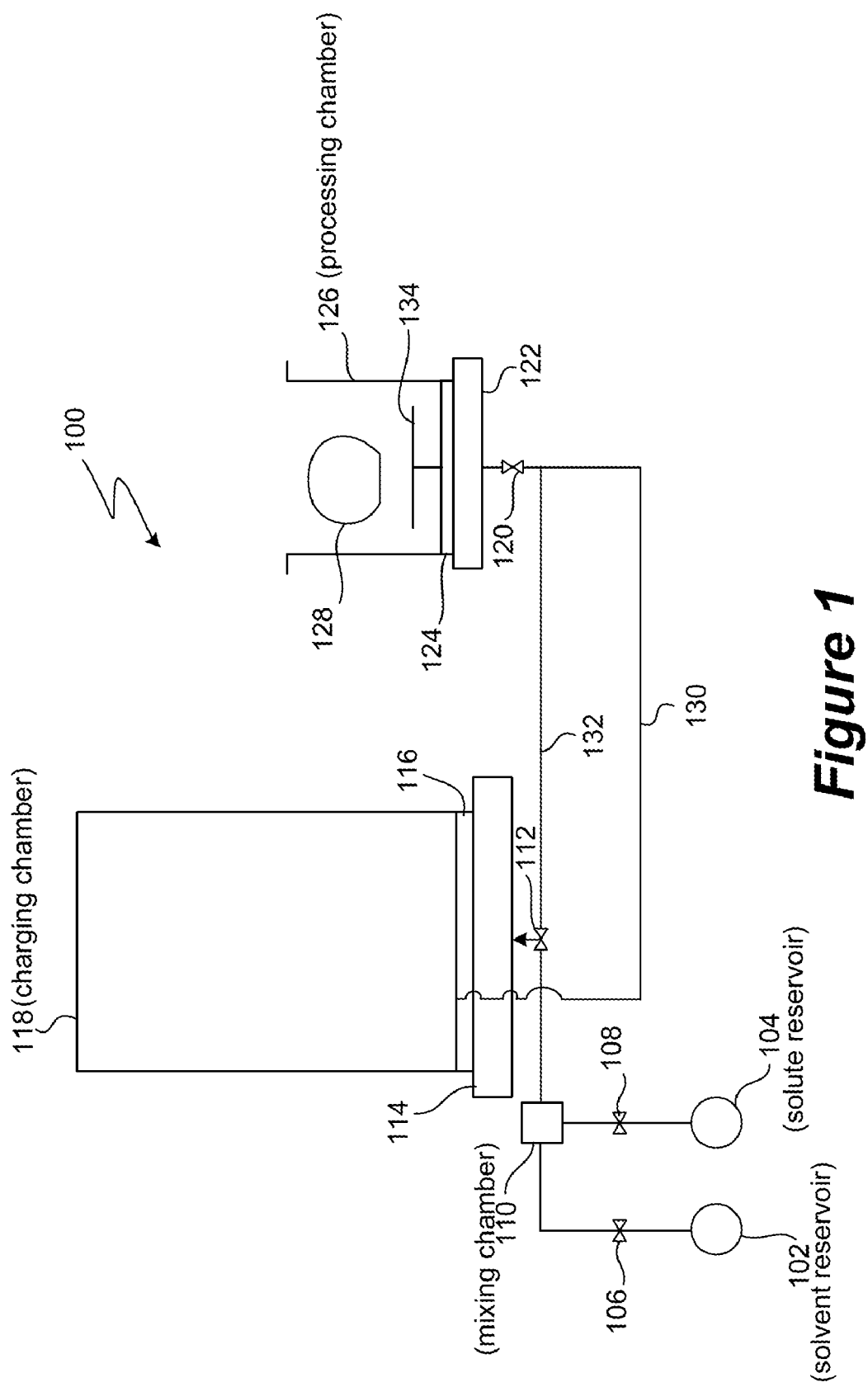
FIG. 1 is a diagram of a cleaning system, according to one embodiment of the present invention, for effectively cleaning integrated circuit substrates.

The present invention provides systems, methods and compositions for effectively cleaning integrated circuit (IC) substrates. Conventional wisdom dictates that for effectively cleaning IC substrates, high enough concentrations of the solute, which is typically an active cleaning ingredient in the cleaning solution, should be used. According to such wisdom, it is believed that high concentrations of the solute react with the substrate surface to detach contaminant particles there-from. Predicated on this belief, conventional wisdom teaches away from using cleaning solutions with relatively low solute concentrations.

In the present invention, however, relatively low solute concentrations of the solute are preferred because they promote charging of a solution. It is believed that in a charged solution, solute particles, which are arranged as clusters, trap detached contaminant particle for effective removal from the substrate. As a result, the present invention focuses on forming solute clusters for effective cleaning of IC substrates. Notably, the inventive cleaning systems and methods described herein not only provide a way to clean substrates using relatively low solute concentrations, which are deemed ineffective in conventional cleaning, rather such low solute concentrations represent preferred embodiments of the present invention.

FIG. 1 shows a cleaning system 100, according to one embodiment of the present invention, for effectively cleaning IC substrates. System 100 has three chambers—a mixing chamber 110 for mixing a solute and a solvent to form a solution, a charging chamber 118 for charging the solution and a processing chamber 126 for cleaning the IC substrates using the charged solution. Each of mixing chamber 110 and charging chamber 118 connect through separate connections to processing chamber 126. Specifically, a first connection 132 connects mixing chamber 110 to processing chamber 126 and a second connection 130 connects charging chamber 118 to processing chamber 126. As will be explained below, first connection 132 can also be used to convey a solvent from its reservoir directly to processing chamber 126.

Mixing chamber 110 receives a solvent stream from a solvent reservoir 102 and the solute stream from a solute reservoir 104 through valves 106 and 108, respectively. A valve 112 is activated to convey the contents of mixing chamber 110 to charging chamber 118. Charging chamber 118 comes equipped with a first acoustic energy source 114 and a coupling chamber 116 for coupling the continuous energy transmission into the charging chamber. Contents of mixing chamber 110 can also be emptied into processing chamber 126 through first connection 132 when valves 112 and 120 are activated. As shown in FIG. 1, solvent from solvent reservoir 102 can be conveyed through mixing chamber 110 and first connection 132 to processing chamber 126. Using a similar path, solvent from solvent reservoir 102 can also be conveyed through valve 106, mixing chamber 110 and first connection 132 to a location on the second connection where the charged solution is diluted, before it is introduced into processing chamber 126. Contents of charging chamber 118 are conveyed to processing chamber through second connection 130 when valve 120 is activated.

Similar to charging chamber 118, processing chamber 126 is also fitted with a second acoustic energy source 122 and a coupling chamber 124 for coupling the continuous energy transmission into processing chamber 126. Inside processing chamber 126, a sparger 134 facilitates well distributed flow of the charged solution for effectively cleaning a vertically disposed IC substrate 128, which is secured on a suitable carrier (not shown to facilitate illustration).

Mixing chamber 110 may be any equipment known in the art that can controllably combine a flow of at least one liquid with a flow of at least one gas. Charging chamber 118 and processing chamber 126 can be made of any material known to be a good transmitter of acoustic energy. These chambers are preferably made from quartz. Although FIG. 1 describes three chambers as three separate vessels, it is possible that the three chambers could be incorporated into two vessels or a single vessel. The preferred embodiment, however, is to have three separate vessels as shown in FIG. 1.

Acoustic energy sources 114 and 122 can be any source that supplies megasonic energy and the like. Charging chamber 118 and processing chamber 126 are ideally placed above their corresponding acoustic energy sources and their coupling chambers. Use of megasonic energy is, however, preferred because it is more effective at removing smaller particles from the substrate surface. Although the megasonic device used in system 100 can have outputs as high as 5 Watts/cm$^2$ and higher, it is preferable to use an output of 3 Watts/cm$^2$ and lower. Suitable equipment for generating megasonic energy is commercially available from a variety of vendors. Such equipment should, however, preferably include a generator and a series special transducers or the like. By way example, megasonic devices, which are commercially available from Kaijo Corporation of Japan and PCT Systems, Inc. of Fremont, Calif. work well.

Although in FIG. 1, one IC substrate 128 is shown inside processing chamber 126, those skilled in the art will recognize that in certain embodiments, processing chamber 126 can be designed to hold more than one substrate or a cassette of many substrates. In preferred embodiments, however, processing chamber 126 is designed to clean one IC substrate at a time in series. FIG. 1 also shows that substrate 128 is oriented vertically during cleaning operations inside processing chamber 126. It is, however, not necessary for the substrate to be vertical. A substrates oriented such that its surface is titled at an angle in the range from about zero degrees to about ten degrees can be effectively cleaned using the inventive systems and methods described herein. When more than one planar substrate (e.g., a semiconductor wafer) is simultaneously cleaned inside processing chamber 126, a slight tilt away from the vertical, i.e., ninety degrees, is desired to prevent adjacent substrates from being jostled against each other. In those embodiments, where a substrate carrier is used, a slight tilt prevents the substrates from being jostled against the carrier. Such titling is optional and under certain circumstances may not be desirable. In a substrate carrier, substrates are arranged face to face, back to back, face to back or back to face. Face to face and back to back are, however, preferred orientations.

A typical cleaning process in system 100 begins when a solvent, typically deionized water, stored in solvent reservoir 102 flows to mixing chamber 110 by activating valve 106. Similarly, a solute from solute reservoir 104 enters the same chamber 110 via valve 108 so mixing may commence to form a solution. Solute reservoir 104 may contain any solute that facilitates removal of a particulate contaminant from the substrate surface. In certain embodiments of the present invention, solute reservoir 104 contains ammonium hydroxide as either a concentrated solution in liquid form or as an aqueous solution. In a preferred embodiment, solute reservoir 104 contains ammonia gas, which allows the use of ammonium hydroxide in extremely low concentrations. In such preferred embodiments, before mixing ammonia gas with deionized water, ammonia gas is filtered to bring its purity to about 99.99999%. Those skilled in the art will recognize that depending on the type of particulate contaminants to be removed from the substrate surface, other types of solutes, different from ammonium hydroxide, may be used. By way of example, a solution includes other chemicals, such as $O_3$, HCl, $H_2O_2$, $NH_4OH$ and HF. These solutes are usually mixed with deionized water to a solution which is subsequently used for cleaning. Alkaline based solutions tend to remove particles of silicon, carbon, and their derivatives. Acid based solutions, such as that made using HCl, remove metal contaminants from the substrate surface. In those embodiments where ammonium hydroxide is used, the volumetric ratio of ammonium hydroxide to deionized water is generally between about $3\times10^{-5}$:1 and about $1\times10^{-9}$:1, and preferably between about $1\times10^{-6}$:1 and about $1\times10^{-8}$:1.

By activating valve 112, the solution formed in mixing chamber 110 is conveyed to charging chamber 118. An acoustic energy source 114, preferably a megasonic device, through a coupling chamber 116 supplies sufficient energy to charge the solution to create a coherent solution inside charging chamber 118. As a result, inside chamber 118, a relatively dilute solution is transformed from an uncharged state to a charged state by the aid of a megasonic device.

FIGS. 2A and 2B illustrate the difference in solute particle distribution from a solution's uncharged state to a charged state. In FIG. 2A, which shows an uncharged solution 200, solute particles 202 are randomly distributed throughout solution 200. In FIG. 2B, which shows a charged solution 210, solute particles 214 are organized in solution 210 as clusters 212. In a preferred embodiment of the present invention, an average number of molecules of solute 214 in clusters 212 is between about 100 and about 200 molecules per cluster. Those skilled in the art will recognize that in each of solutions 200 and 210, the solute particles are dissolved in a solvent, which is not shown in FIGS. 2A and 2B to simplify illustration and facilitate discussion. Furthermore, clusters 212 need not have a circular shape with a smooth exterior, as shown in FIG. 2B. Rather, clusters 212 are generally of any irregular shape.

Although cluster formation is predominant at 0° C., cleaning inside processing chamber 126 should be carried out at about 30° C. or below 30° C. Test data obtained from various experiments suggests that at room temperature or at about 30° C., there are sufficient number of solute molecules within the clusters to trap the detached contaminant particles from the substrate surface and provide the necessary electromotive force ("EMF") for holding onto such particles. At higher temperatures, cluster formation appear to melt away and only a few molecules are left within a very small cluster. Consequently, substrate cleaning is more effective at around room temperature than at relatively higher temperatures.

The charged solution exiting charging chamber 118 has solute present in the solvent in a volumetric ratio that is between about $5\times10^{-5}$:1 and about $1\times10^{-24}$:1, preferably between about $1\times10^{-6}$:1 and about $1\times10^{24}$:1, and more preferably between about $1\times10^{-8}$:1 and about $1\times10^{24}$:1.

By activating valve 120, some of the charged solution is introduced through first connection 130 into processing chamber 126 for cleaning substrate 128. Although only one inlet to process chamber 126 is shown in FIG. 1, those skilled in the art will recognize that if more than one stream of solution is required for cleaning then additional inlets to chamber 126 can be provided.

Inside processing chamber 126, the charging solution is introduced by a sparger 134 located at the bottom. The charging solution fills the processing chamber 126 from the bottom as described in U.S. Pat. No. 6,681,781 issued to Puri et al. Processing chamber 126 may also come equipped with a drain valve and drain line (not shown to simplify illustration) to dispense the effluent stream. Cleaning of the substrate occurs by causing the charged solution to contact the surface. This is accomplished by any one of spraying the solution onto the surface, by submerging the surface in a charged solution or flowing the solution past the substrate surface. Acoustic energy is applied to the substrate surface, while it is contacting the charged solution.

In preferred embodiments as shown in FIG. 1, system 100 is designed to charge to a greater extent a charged solution stream flowing out of charging chamber 118. First connection 132 facilitates diluting this charged solution using more solvent from solvent reservoir 102 and conveying it to the charged solution inside second connection 130, before it is introduced inside processing chamber 126. Specifically, by activating valves 106 and 112 such solvent is provided from solvent reservoir 102 to the charged solution within second connection 132. In such dilute charged solution, solute is present in a solvent in a volumetric ratio that is between about $5\times10^{-5}$:1 and about $1\times10^{-24}$:1. This preferred embodiment, provides the flexibility of using small amounts of charged solution residing in charging chamber 118 and further diluting it to produce a more effectively charged solution.

Although not shown in FIG. 1, charging chamber 118 can be fitted with a recirculation scheme having one more chambers arranged to recirculate the charged solution, before the charged solution is conveyed for a cleaning operation. In each such chamber, progressive dilutions of the charged solution are possible. The above-described scheme allows effective dilutions of charged solutions having relatively low concentrations of the solute. The flow schemes described above for mixing, charging and cleaning can be carried out in continuous mode, batch and semi-batch mode.

In summary, the present invention relies upon very high pH of the charged near-zero solute dilutions in the cleaning solution to capture and transfer the particulate contaminants which are further detached from the substrate surface using megasonic energy.

The present invention represents a marked improvement over the conventional systems, methods and compositions for cleaning IC substrates. As explained above, the present invention prefers use of charged solutions, which have relatively low concentrations of the solute, i.e., dilutions in the ultra-dilute regime or having "near zero dilutions." Consequently, the cleaning systems and methods of the present invention are environmentally green. In other words, they do not require the additional expense of equipment and labor to treat the effluent stream before draining, which is required by the conventional cleaning systems and methods. Furthermore, in the cleaning system and methods according to the present invention, the significant cost associated with disposing chemicals is eliminated.

According to conventional cleaning methods, the solute concentration is heated to facilitate substrate etching for particle removal. This requires substantial time and equipment. The solute in the present invention, however, effectively cleans at room temperature conditions and does not require such heating. The present invention, therefore, obviates the need for heating equipment and additional processing time.

As explained above, conventional cleaning systems and methods rely upon concentrated solution to etch the substrate surface and thereby remove particulate contaminants. The conventional cleaning, therefore, introduces undesired surface roughness that degrades the electrical performance of the ultimately produced IC. In the present invention, however, the IC substrates are cleaned using charged solutions having low concentrations of the solute. In other words, given that very small quantities of chemicals are being used for cleaning, the substrate surface is unetched. Another advantage of using small quantities of chemicals is that no residue of stabilizers and metal contaminants remain on the substrate surface. In other words, substrates cleaned according to the present invention have little or no stabilizer residue and metal contaminants thereon because chemicals in very small quantities are used during the cleaning process. A yet another advantage of using small quantities of chemicals is that there is no need for a pretreatment step before cleaning the substrate. The present invention, which can effectively clean substrates at "near zero dilutions," do not require an additional pretreatment step, such as ozonation, which is required by conventional cleaning techniques. This also translates into increased throughput when cleaning according to the present invention.

Substrate cleaning, according to the present invention, occurs very rapidly. By way of example, about three to five minutes, and typically about three minutes is sufficient time to effectively clean a substrate. Consequently, the present invention provides a relatively higher throughput. Moreover, if a substrate surface is not sufficiently clean after a single cleaning cycle, then more than one cleaning cycle can be implemented to more effectively clean that surface, without degrading it. Multiple cleaning cycles in the present invention, actually improve the quality of the surface and do not introduce undesired surface roughness, stabilizers or metal contaminants, which are introduced when cleaning according to conventional methods is performed. Those skilled in the art will recognize that such multiple cleaning cycles in conventional cleaning typically destroys the substrate surface.

Although certain examples have been described in terms of cleaning semiconductor substrates, those skilled in the art will recognize that the inventive systems, methods and compositions described herein can be used for other IC substrates. For example, the inventive systems, methods and compositions can be used for effective cleaning of masks, disks, flat panels, liquid crystal displays, thin film heads, photo masks, and lenses.

What is claimed is:

1. A method for cleaning a substrate, comprising:
    acoustically vibrating with sonic energy a solution, which contains at least a solute and a solvent, in a first chamber to produce a charged solution that includes solute clusters, each of which is organized such that said solute is surrounded by a plurality of solvent molecules;
    recirculating said charged solution present inside said first chamber;
    conveying said charged solution to a second chamber, which is different from said first chamber, for cleaning said substrate; and
    wherein each of said first chamber and said second chamber include a bottom surface.

2. The method of claim 1, wherein said vibrating is caused by a megasonic energy.

3. The method of claim 1, wherein said solute is ammonium hydroxide.

4. The method of claim 3, wherein said charging includes diluting said solution such that said ammonium hydroxide is present in a solvent in a volumetric ratio that is between about $5\times10^{-5}$:1 and about $1\times10^{-24}$:1.

5. The method of claim 4, wherein said ammonium hydroxide is present in said solvent in a volumetric ratio that is between about $1\times10^{-6}$:1 and about $1\times10^{-24}$:1.

6. The method of claim 5, wherein said ammonium hydroxide is present in said solvent in a volumetric ratio that is between about $1\times10^{-8}$:1 and about $1\times10^{-24}$:1.

7. The method of claim 1, wherein said recirculating is carried out before said conveying said charged solution.

8. The method of claim 7, further comprising:
    diluting said charged solution to produce a cleaning solution; and
    using said cleaning solution for cleaning said integrated circuit substrate.

9. The method of claim 8, wherein in said cleaning solution, said solute is present in a solvent in a volumetric ratio that is between about $5\times10^{-5}$:1 and about $1\times10^{-24}$:1.

10. The method of claim 8, wherein said using includes applying acoustic energy to said cleaning solution for removing contaminant particles from integrated substrate.

11. The method of claim 1, further comprising mixing a solvent and said solute to produce said solution before said acoustically vibrating said solution.

12. The method of claim 11, wherein said solvent is deionized water.

13. The method of claim 11, wherein said mixing produces said solution having said solute present in said solvent in a volumetric ratio that is between about $3\times10^{-5}$:1 and about $1\times10^{-24}$:1.

14. The method of claim 1, wherein said acoustically vibrating is carried out using a megasonic.

15. The method of claim 14, wherein said megasonic can have outputs of 3 Watts/cm$^2$ and lower.

16. The method of claim 14, wherein said megasonic can have outputs of 5 Watts/cm$^2$ and higher.

17. The method of claim 1, wherein said solute includes any one of $O_3$, HCl, $H_2O_2$, $NH_4OH$, HF and $NH_3$.

18. The method of claim 1, wherein said charging includes supplying sufficient energy to charge said solution and create a coherent solution inside said first chamber.

19. The method of claim 1, wherein said solute clusters have an electromotive force.

* * * * *